(12) United States Patent
Pappu et al.

(10) Patent No.: US 11,686,767 B2
(45) Date of Patent: Jun. 27, 2023

(54) SYSTEM, APPARATUS AND METHOD FOR FUNCTIONAL TESTING OF ONE OR MORE FABRICS OF A PROCESSOR

(71) Applicant: Intel Corporation, Santa Clara, CA (US)

(72) Inventors: Lakshminarayana Pappu, Folsom, CA (US); Robert P. Adler, Santa Clara, CA (US); R. Selvakumar Raja Gopal, Tapah (MY)

(73) Assignee: Intel Corporation, Santa Clara, CA (US)

( * ) Notice: Subject to any disclaimer, the term of this patent is extended or adjusted under 35 U.S.C. 154(b) by 1255 days.

(21) Appl. No.: 15/801,443

(22) Filed: Nov. 2, 2017

(65) Prior Publication Data
US 2019/0033367 A1    Jan. 31, 2019

(51) Int. Cl.
*G01R 31/3193*    (2006.01)
*G01R 31/3177*    (2006.01)
*G01R 31/3183*    (2006.01)
*G01R 31/319*    (2006.01)
*G01R 31/317*    (2006.01)
*G06F 11/27*    (2006.01)
(Continued)

(52) U.S. Cl.
CPC ... *G01R 31/3177* (2013.01); *G01R 31/31723* (2013.01); *G01R 31/31724* (2013.01); *G01R 31/31835* (2013.01); *G01R 31/31919* (2013.01); *G01R 31/31935* (2013.01); *G01R 31/318385* (2013.01); *G06F 11/2236* (2013.01); *G06F 11/27* (2013.01); *G06F 7/582* (2013.01)

(58) Field of Classification Search
CPC ......... G01R 31/3177; G01R 31/31835; G01R 31/31919; G01R 31/31724; G01R 31/318385; G01R 31/31723; G01R 31/31935; G01R 21/31835; G01R 1/31835; G06F 11/27; G06F 11/2236; G06F 7/582
USPC .......................................................... 714/724
See application file for complete search history.

(56) References Cited

U.S. PATENT DOCUMENTS 7,698,609 B2 *    4/2010    Laila ................... G05B 19/0421
                                                        714/724
7,921,342 B2 *    4/2011    Bancel ........... G01R 31/318536
                                                        714/724
(Continued)

OTHER PUBLICATIONS

Intel Corporation, "Product Brief. Intel Go Autonomous Driving Solutions. Autonomous Driving Accelerated," Nov. 2016, 6 pages.
(Continued)

*Primary Examiner* — Albert Decady
*Assistant Examiner* — Enam Ahmed
(74) *Attorney, Agent, or Firm* — Trop, Pruner & Hu, P.C.

(57) ABSTRACT

In one embodiment, an apparatus includes at least one fabric to interface with a plurality of intellectual property (IP) blocks of the apparatus, the at least one fabric including at least one status storage, and a fabric bridge controller coupled to the at least one fabric. The fabric bridge controller may be configured to initiate a functional safety test of the at least one fabric in response to a fabric test signal received during functional operation of the apparatus, receive a result of the functional safety test via the at least one status storage, and send to a destination location a test report based on the result. Other embodiments are described and claimed.

20 Claims, 8 Drawing Sheets

(51) Int. Cl.
  *G06F 11/22* (2006.01)
  *G06F 7/58* (2006.01)

(56) References Cited

U.S. PATENT DOCUMENTS

| | | | | |
|---|---|---|---|---|
| 8,286,043 | B2* | 10/2012 | Sakada | G01R 31/005 |
| | | | | 714/724 |
| 8,666,642 | B2* | 3/2014 | Stempnik | F02D 41/22 |
| | | | | 714/724 |
| 8,677,306 | B1* | 3/2014 | Andreev | G06F 11/267 |
| | | | | 714/39 |
| 8,682,501 | B2* | 3/2014 | Hosotani | G11C 29/38 |
| | | | | 714/724 |
| 8,929,373 | B2 | 1/2015 | Lakshmanamurthy et al. | |
| 9,215,124 | B2* | 12/2015 | Yousefi | H04L 49/25 |
| 9,436,623 | B2 | 9/2016 | Wertheimer | |
| 10,691,570 | B1* | 6/2020 | Lui | G06F 11/27 |
| 2004/0216020 | A1* | 10/2004 | Stiller | B60T 8/172 |
| | | | | 714/724 |
| 2006/0259837 | A1* | 11/2006 | Teranishi | G05B 19/058 |
| | | | | 714/724 |
| 2008/0034260 | A1* | 2/2008 | Wanner | H04L 12/40169 |
| | | | | 714/724 |
| 2012/0117433 | A1* | 5/2012 | Feng | G01R 31/31719 |
| | | | | 714/724 |
| 2013/0083798 | A1 | 4/2013 | Lakshmanamurthy et al. | |
| 2013/0268808 | A1* | 10/2013 | Patil | G06F 11/263 |
| | | | | 714/32 |
| 2015/0092779 | A1 | 4/2015 | Lakshmanamurthy et al. | |
| 2015/0293173 | A1* | 10/2015 | Tsuboi | G06F 11/08 |
| | | | | 714/727 |
| 2015/0301108 | A1* | 10/2015 | Hamid | G01R 31/31813 |
| | | | | 714/724 |
| 2016/0285434 | A1 | 9/2016 | Menon | |
| 2016/0327959 | A1* | 11/2016 | Brown | G05D 1/104 |
| 2017/0032402 | A1* | 2/2017 | Patsiokas | G06Q 30/0261 |
| 2017/0139411 | A1* | 5/2017 | Hartung | G05D 1/0077 |
| 2017/0184666 | A1 | 6/2017 | Pappu et al. | |
| 2018/0322387 | A1* | 11/2018 | Sridharan | G06N 3/084 |
| 2019/0049513 | A1* | 2/2019 | Azam | G11C 29/32 |
| 2019/0138408 | A1* | 5/2019 | Menon | G06F 11/27 |
| 2020/0034262 | A1* | 1/2020 | Bemanian | G06F 15/8007 |
| 2020/0192603 | A1* | 6/2020 | Tanriover | G06F 9/466 |
| 2021/0053407 | A1* | 2/2021 | Smith | B60D 1/64 |
| 2021/0303481 | A1* | 9/2021 | Ray | G06T 1/60 |

OTHER PUBLICATIONS

Infineon, "Highly Integrated and Performance Optimized 32-bit Microcontrollers for Automotive and Industrial Applications," Mar. 2017, 62 pages.

U.S. Appl. No. 15/718,178, filed Sep. 28, 2017, entitled "System, Apparatus and Method for Tunneling Validated Security Information," by Ruirui Huang, et al.

U.S. Appl. No. 15/391,984, filed Dec. 28, 2016, entitled "Method, Apparatus and System for Handling Non-Posted Memory Write Transactions in a Fabric," by Robert P. Adler, et al.

U.S. Appl. No. 15/338,639, filed Oct. 31, 2016, entitled "Method, Apparatus and System for Automatically Performing End-To-End Channel Mapping Foran Interconnect," by Krishnan Srinivasan, et al.

U.S. Appl. No. 15/801,454, filed Nov. 2, 2017, entitled "Method, Apparatus and System for Inter-Die Functional Testing of an Integrated Circuit," by Lakshminarayana Pappu, et al.

U.S. Patent and Trademark Office, Office Action dated Dec. 9, 2020 in U.S. Appl. No. 15/801,454 with Reply to Office Action filed Mar. 3, 2021, 31 pages total.

* cited by examiner

SYSTEM, APPARATUS AND METHOD FOR FUNCTIONAL TESTING OF ONE OR MORE FABRICS OF A PROCESSOR

TECHNICAL FIELD

Embodiments relate to a processor having self testing capabilities.

BACKGROUND

In integrated circuits (ICs), fabrics and other interconnects are used as a backbone for system data transfer between cores and other intellectual property (IP) logic circuits of the ICs. Functional safety requirements from certain industries such as medical and automotive industries, dictate silicon manufacturers to meet stringent requirements for low defects (e.g., 10-15 defects per million (DPM), especially for components that are integrated into autonomous driving systems. Typical ICs manufactured for use in general-purpose computing systems (e.g., personal and server computers) have difficulty meeting such requirements without a substantial product cost increase.

Factors that contribute to the high DPM of typical ICs include high process defect density (e.g., in process nodes of 14 nanometers and smaller), walking dead units and non-uniform aging of components. The term "walking dead unit" refers to an IC that passes initial product testing and burn-in, but fails when used in the field. Current product testing schemes include manufacturing-based testing by a manufacturer of the IC and/or a platform manufacturer that incorporates the IC within a given platform. However, such testing is inadequate once an IC is dispositioned into a platform and sent into the field for normal operation.

DETAILED DESCRIPTION

In various embodiments, integrated circuits such as processors or other systems on chip (SoC) may be provided with techniques to periodically trigger and perform in-field self testing. More specifically, techniques disclosed herein provide a dynamic functional safety testing capability for fabrics and other interconnects of a processor. In embodiments, such in-field self testing may be performed according to one or more test patterns which may be obtained in different manners.

In some cases these test patterns may be obtained from a non-volatile memory to which the processor is coupled. In other cases, as described herein internal circuitry of the processor may itself generate such test patterns. More generally, the self-test patterns are referred to herein as "test programs" which may include such test patterns, as well as additional testing information, such as operating parameters for the testing, indicated locations at which the testing is to be performed, reporting characteristics and so forth. Other programmable parameters may include whether to send posted transactions or non-posted transactions. For posted transactions, a completion is not received from the destination, while a destination responds to a non-posted transaction with completion data. Also seed data may be included to be launched with transactions. With such seed, the sequence of data command/data generation can be determined.

In implementations in which a test program is stored in a non-volatile memory, to enhance security, a security circuit such as a separate component coupled to the processor, may obtain the test program, validate its contents, and thereafter communicate the test program via an on-package-interface to a fabric bridge controller of the processor. In implementations in which a test program is internally generated, the fabric bridge controller or other circuitry of the processor may be configured to perform test generation itself.

As described further herein, this programmable fabric bridge controller may be configured to receive test programming, initiate and control such testing, analyze results and send information regarding the results to one or more destinations, such as the non-volatile storage, for later access by a system entity. Still further in the case of identification of one or more failures or other errors, the fabric bridge controller may be configured to communicate such error/failure information to a given destination, such as an end user or other system entity. For example, a basic input/output system (BIOS) may be configured to read test result information and, in the instance of an error/failure, inform a system controller for an action to be taken. Although embodiments are not limited in this regard, an example such action may include shutting down the system until a corrective action takes place. In other cases, particularly where no failures are indicated, test result information may simply be stored in a given location for later access. For example, test results may be stored in association with the security circuit, which may at a later time provide such test result information to a non-volatile memory, to be later read by the BIOS for system reporting.

By using on-die low cost hardware, embodiments realize techniques to meet functional safety goals by detecting fabric defects and error reporting in a given platform such as an autonomous vehicle system. Still further, by periodically triggering the in-field testing, a dynamic testing capability is realized. Using such testing, various defects, including walking dead units and units that fail due to environmental conditions, can be readily identified. As such, embodiments enhance a semiconductor manufacturer's ability to meet low DPM critical system requirements without notably increasing costs. Although the scope of the present invention is not limited in this regard, in embodiments periodic (e.g., key-on/key-off) testing allows certain circuitry to be regularly tested to potentially identify fabric-specific defects (e.g., latent faults) and checker circuitry defects (e.g., data and command parity errors).

In different implementations, the fabric bridge controller has multiple programmable options. As a first option, the fabric bridge controller may use a customized test program obtained from a non-volatile memory. As a second option, the fabric bridge controller may use an in-built capability to locally generate tests and launch transactions onto the fabrics. In embodiments, a determination of which fabrics are to be tested and the order of testing may be based on criticality.

Although embodiments are not limited in this regard, a test program may exercise various circuitry using different operations. For example, the test program may case generation of posted transactions to various intellectual property (IP) blocks and/or error injection into command/data blocks. Similarly non-posted transactions can be sent to various IP blocks, which may respond, to enable data to be observed in the fabric bridge controller.

In an embodiment, the fabric bridge controller may collect test results and analyze and/or aggregate such results to generate a final status, which may be communicated to the security circuit. In turn, the security circuit may send test results to the non-volatile storage. In another case, firmware such as BIOS can also read the status directly from the security circuit. BIOS may eventually report this status to a system monitor to determine an action to be taken.

In some cases, the action to be taken depends upon the criticality of the error. For a correctable error, the fabric bridge controller may initiate error correction. One example of a correctable error is an error correction coding (ECC)-based single error correction. An uncorrectable error may cause an alert to a user (such as a driver) to drive a vehicle to safety or prompt the driver to switch into a manual mode, thereby shutting down an autonomous vehicle system until a corrective measure is taken.

Figure 1:
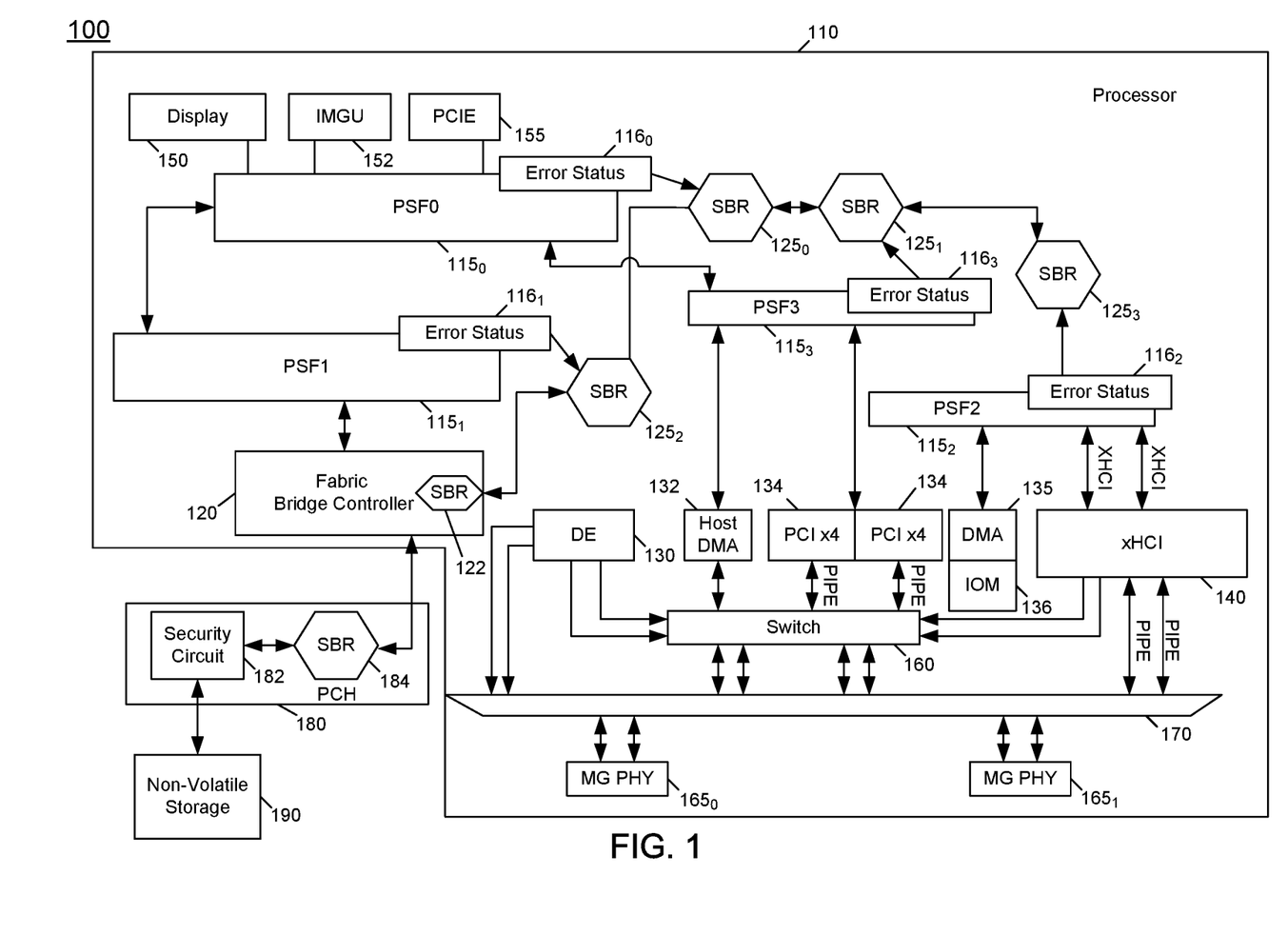
FIG. 1 is a block diagram of a portion of a computing system in accordance with an embodiment.

Referring now to FIG. 1, shown is a block diagram of a portion of a computing system in accordance with an embodiment. As examples, computing system 100 may be an automotive computing system, an industrial computing system, a medical computing system or so forth. As such, computing system 100 may be configured to have high availability to enable mission critical operations to occur over long periods of time without error. To this end, computing system 100 may be configured with components to perform functional safety testing during normal operation of the system, to identify and potentially correct errors, as well as to report uncorrectable (and possibly correctable) errors to an appropriate destination.

More specifically as will be described herein, computing system 100 is configured to perform functional safety testing of one or more fabrics implemented within a processor 110. As described herein, processor 110 may be a multicore processor, system on chip (SoC) or any other computing integrated circuit. To enable high availability for mission critical applications, processor 110 is configured to perform functional safety testing of one or more fabrics included within processor 110.

Computing system 100 further includes additional platform components that couple to processor 110. As seen, a peripheral controller hub (PCH) 180 may be implemented as a separate integrated circuit coupled to processor 110. Although shown as a separate integrated circuit, in other embodiments at least some of the circuitry of PCH 180 may be implemented within processor 110. In addition, computing system 100 further includes a non-volatile storage 190 which, in an embodiment may be implemented as a flash memory. In addition to storage of various platform information including system firmware, system software, data and so forth, non-volatile memory 190 further is configured to store test information for use as described herein.

FIG. 1 illustrates some details of processor 110. Understand however that the illustration of processor 110 is at a relatively high level; a given processor may include more or fewer components, and may be differently configured. In any event, processor 110 includes a plurality of fabrics $115_0$-$115_3$. Understand while four fabrics are shown for ease of illustration a given implementation may include more or fewer fabrics. In the embodiment shown, fabrics 115 (generically) may be implemented as primary scalable fabrics (PSFs) to which various IP agents such as processor cores, accelerators, fixed function units, security circuits, interfaces, switches, routers, and so forth may couple (generally referred to herein as "IP logics" or "IP blocks"). Note that in an embodiment, PSFs may be integrated on-chip scalable fabrics (IOSFs), which may be designed according to a given specification of a semiconductor manufacturer to provide a standardized on-die interconnect protocol for attaching IP blocks within a chip.

For the most part, such IP blocks are not shown in FIG. 1 to avoid obscuring the fabric-based testing functionality described herein. However certain IP blocks are shown to couple to certain fabrics. Specifically, fabric $115_0$ may include multiple internal ports or other interfaces to enable coupling to a display circuit 150, an image processing unit 152 and a Peripheral Component Interconnect Express (PCIe) circuit 155. In turn, these various IP blocks may couple to other components both internally and externally to processor 110. Understand that cores and other agents may couple to one or more fabrics 115, e.g., via coherent interconnects.

As will be described further herein, processor 110 includes a fabric bridge controller 120. In embodiments, fabric bridge controller 120 may be configured to control in-field functional safety testing of fabrics within processor 110. Still further, fabric bridge controller 120 is configured to interact with additional circuitry of computing system 100, including PCH 180 to enable a secure communication pathway and further to access test information within non-volatile memory 190.

As illustrated, fabric bridge controller 120 includes a sideband router 122, which may enable communication of sideband information, including the results of functional testing as described herein. More specifically, sideband router 122 may enable communication of error status information, e.g., from fabrics 115 (as stored in a corresponding error status storage 116 of a given fabric). To this end, each fabric may include a sideband interface to couple to a corresponding sideband router ($125_0$-$125_3$) of a sideband network to enable communication of various sideband information, including error reporting information and other test result information from each of fabrics 110 to fabric bridge controller 120. In an embodiment, transactions may proceed via this sideband network according to a sideband protocol of the same IOSF specification applicable to the PSFs. Fabric bridge controller 120 may process such information to perform error detection, error correction, test reporting, and so forth.

Still referring to FIG. 1, a display engine (DE) 130 sends display streams to an external display screen and couples between a switch 160 (which in an embodiment may be implemented as a Thunderbolt™ switch) and an input/output (I/O) adapter 170. In one embodiment, I/O adapter 170 may be a flexible I/O adapter (FIA). I/O adapter 170 in turn provides an interface to multiple physical units (PHY), including PHYs $165_0$-$165_1$. As further illustrated, switch 160 also couples to additional components of processor 110. In the embodiment shown, switch 160 couples to a host direct memory access (DMA) circuit 132 that further couples to fabric $115_3$. In addition, switch 160 may couple via one or more PHY Interface for PCI Express (PIPE) interfaces to PCI interfaces 134, also coupled to fabric $115_3$.

Still further, switch 160 also couples to an extended host controller interface (xHCI) 140 that further couples via PIPE links to I/O adapter 170 and via xHCI links to fabric 115₂.

As seen, PCH 180 includes a security circuit 182. In an embodiment, security circuit 182 may be implemented as a dedicated security processor such as a coprocessor, security engine, converged security engine or so forth. As will be described herein, security circuit 182 couples to non-volatile storage 190 and may receive incoming test information that is encrypted and signed. Security circuit 182 may validate such test information and upon validation, decrypt it and provide the decrypted test information via a sideband router 184 to fabric bridge controller 120. Understand while shown at this high level in the embodiment of FIG. 1, many variations and alternatives are possible.

Figure 2:
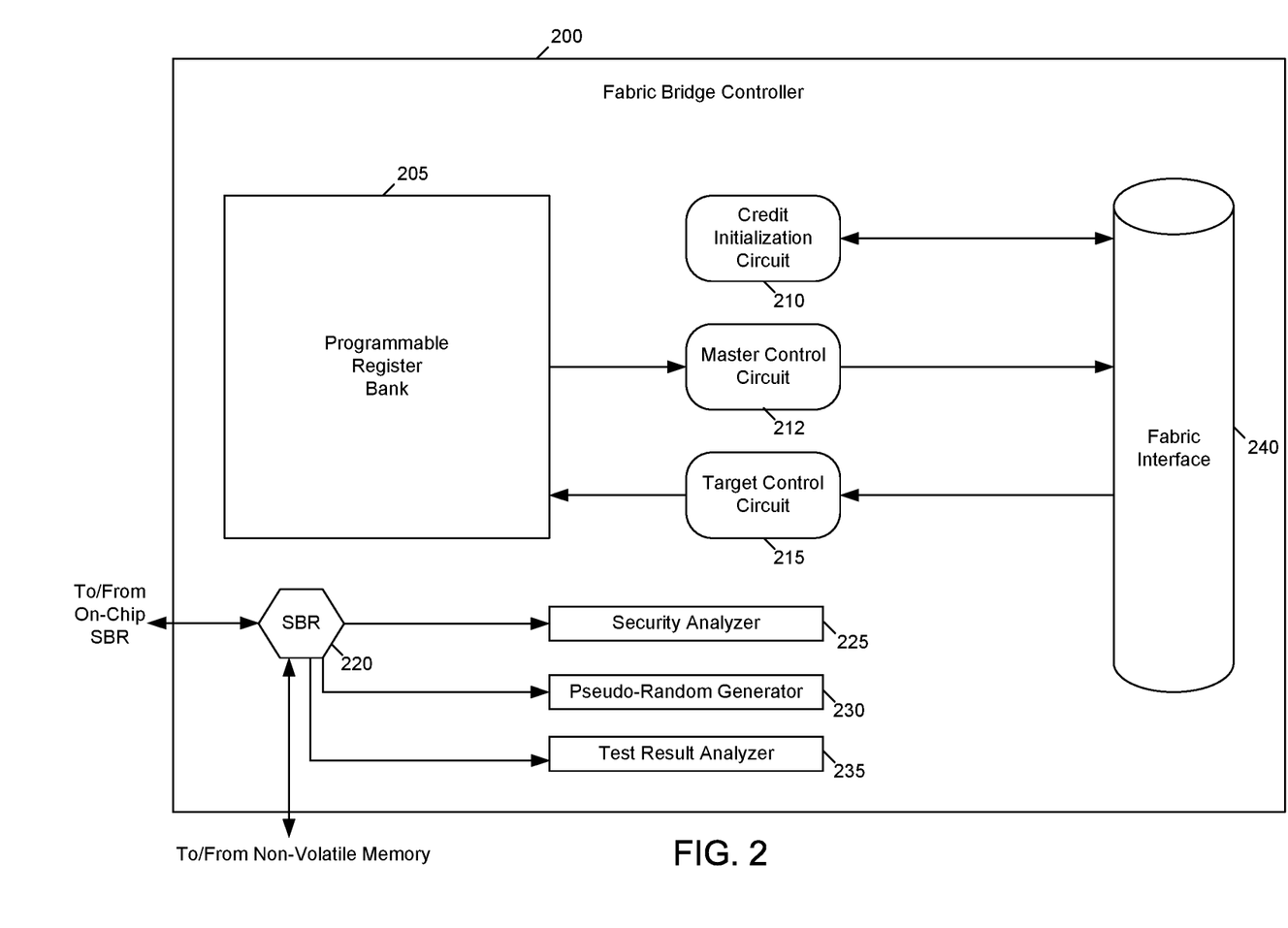
FIG. 2 is a block diagram of a fabric bridge controller in accordance with an embodiment of the present invention.

Referring now to FIG. 2, shown is a block diagram of a fabric bridge controller in accordance with an embodiment of the present invention. More specifically, fabric bridge controller 200 is a more detailed depiction of fabric bridge controller 120 of FIG. 1. As such, fabric bridge controller 200 may with both communicate on-chip and off-chip sources. More specifically, via a sideband router 220, fabric bridge controller 200 may communicate with a non-volatile memory (e.g., as intermediated by a security circuit or other PCH circuitry) and similarly may communicate with at least one on-chip sideband router. In addition, fabric bridge controller 200 may communicate with at least one on-chip primary fabric via a fabric interface 240.

The programmability of fabric bridge controller 200 may include several programmable options. As examples, this programmability includes whether to generate an on-die test program to test circuitry (e.g., particular IP logics, fabrics and so forth), and program a seed value to start the test content generation. Additional programmability may include the target fabric segment and IP logics to be tested, the order of system fabric testing, and so forth.

Still further programmability may include which information from the test results deemed critical and non-critical for the final reporting. As an example, errors that can be corrected by the fabrics with already-present redundant hardware are deemed non-critical, and errors that cannot be corrected are reported as critical. Note that this criticality programmability is in addition to BIOS/software decoding criticality of reported errors. Note that fabric bridge controller 200 may be configured to communicate with every IP logic and fabric component of a SoC.

As further illustrated, fabric bridge controller 200 includes a programmable register bank 205. Register bank 205 may be configured to host transactions arriving from the external flash memory or that are internally generated. Register bank 205 may further collect transactions that are received by fabric bridge controller 200 from IP blocks. In an embodiment, separate sets of registers may be allocated within register block 205 for posted, non-posted and completion transactions. Programmable register bank 205 may be configured to be programmably controlled to initiate test operations based on testing information, e.g., received from the non-volatile memory. Programmable register bank 205 further may receive testing information that is generated within fabric bridge controller 200 itself. More specifically, fabric bridge controller 200 includes a pseudo-random generator 230 that is configured to generate testing information that may be used to perform functional safety testing of one or more fabrics.

Fabric bridge controller 200 further includes a test result analyzer 235 that is configured to receive results of fabric testing and determine pass/fail status, error information and so forth. Security analyzer 235 may aggregate results from multiple fabrics and IP block and generate an aggregated test report.

A security analyzer 225 is also present within fabric bridge controller 200, and may be used to perform security checks on incoming test information received from off-chip. In an embodiment, this security information may be in the form of security attributes of initiator (SAI) information. Note that while operating in a bridge mode, fabric bridge controller 200 conduits the security information, e.g., the SAI of an external security circuit and does not include its own SAI. In other functional safety testing modes, fabric bridge controller 200 may send its own SAI. With this bridge mode, it is ensured that no fabric/endpoint drops test packets initiated by fabric controller 200 due to an unrecognized SAI. This is the case, as the SAI of the security circuit is considered a trusted SAI, such that all fabric/endpoints honor this SAI. Test result analyzer 235 may perform several security checks during this mode. For every incoming transaction, the SAI is checked against an allowed set of SAIs and in case of a mismatch, the operation is aborted. The encrypted test transferred from the flash memory is decrypted with a stored key and a checksum of the program is validated against an expected value to detect any program tampering.

To enable fabric testing to occur, programmable register bank 205 couples to a master control circuit 212 which, in an embodiment may be implemented as a finite state machine (FSM). In an embodiment, master control circuit 212 may be configured to put a request onto a fabric when an inject command is received from a control register of programmable register bank 205. Master circuit 212 may also be configured for steering a first in first out (FIFO) unload pointer logic when a corresponding grant is received from the fabric. In turn, incoming test result information may be received, via fabric interface 240, in a target control circuit 215. In an embodiment, target control circuit 215 may be configured as an N-state FSM, and is responsible for polling for receive signals from the fabric. Note that test transactions as obtained or generated within fabric bridge controller 200 may be communicated via fabric interface 240 based on credit information generated within credit initialization circuit 210. In an embodiment, credit initialization circuit 210 may be implemented as an FSM such as an idle state machine to control when transactions are allowed on a master channel of the interface. The ISM also provides a protocol for clock gating and credit initialization.

Figure 3:
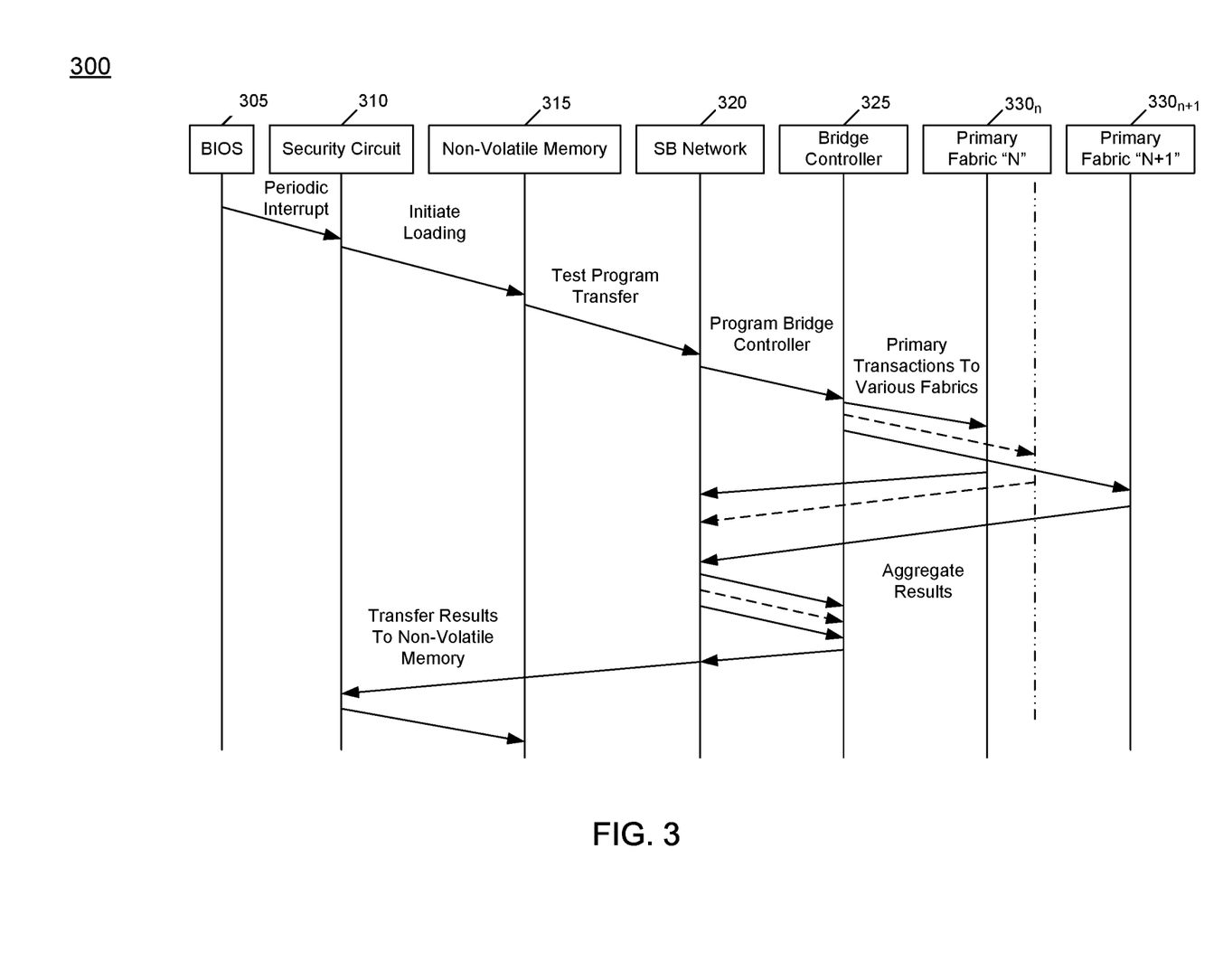
FIG. 3 is a high level view of a method for functional testing in accordance with an embodiment.

Referring now to FIG. 3, shown is a high level view of a method for functional safety testing in accordance with an embodiment. As illustrated in FIG. 3, a transaction flow 300 for performing fabric functional safety testing may be initiated by a BIOS 305. Understand of course that in other embodiments, another system software or firmware agent may initiate this functional safety testing. More specifically, BIOS 305 may issue periodic interrupts during normal system operation, when it is feasible or possible to perform the functional safety testing. In an autonomous vehicle system example, such interrupts may be triggered when a vehicle is idle, such as stopped at a stop light or so forth. In other cases, functional safety testing may be initiated in response to an interrupt in response to key on and/or key off conditions, when the vehicle is powered on or off.

As illustrated, these periodic interrupts are provided via a security circuit 310, which verifies that the interrupts are received from a trusted source (namely BIOS 305). If this is the case, security circuit 310 interacts with a non-volatile memory 315 to initiate loading of one or more test programs, which may be transferred through a sideband network 320 to a fabric bridge controller 325. In response to receipt of this test program information, fabric bridge controller 325 may program itself for a given type of functional safety testing. As such, fabric bridge controller 325 issues various transactions of the functional safety testing to multiple fabrics of a processor, here represented by primary fabrics $330_n$-$330_{n-1}$. Some of these transaction types include: configuration (Cfg) transactions that configure various IP blocks; posted writes that target (e.g.) control registers inside IP blocks; and non-posted reads that read data from (e.g.) registers inside the IP blocks. Of course, understand that more fabrics may be present in a particular embodiment. Still further, while embodiments are described herein for testing primary fabrics, understand the scope of the present invention is not limited in this regard and in other cases, other types of fabrics or interconnects, such as secondary fabrics or so forth, also may be tested using the techniques described herein.

As illustrated, fabrics 330 may communicate results of the testing via sideband network 320 to fabric bridge controller 325, which may aggregate the results and take appropriate action. In an embodiment, bridge controller 325 may send sideband request messages to obtain the test result information. Assuming that all tests pass, an aggregated test report to provide these results may be communicated to security circuit 310. In turn, security circuit 310 may log the report in non-volatile memory 315 to be later accessed by the system. Note that if a correctable error is identified, fabric bridge controller 325 may initiate mechanisms to correct the error, such as identifying an erroneous memory block within a memory map to disable the memory block. Similar operations to identify failed circuitry that may be disabled and replaced with spare circuitry also may be performed. In the case of uncorrectable errors or other failures, fabric bridge controller 325 may generate an error report and send the error report via security circuit 310, which may raise a system error indicator, to enable the system to take appropriate measures. Understand while shown at this high level in the embodiment of FIG. 3, many variations and alternatives are possible.

Figure 4A:
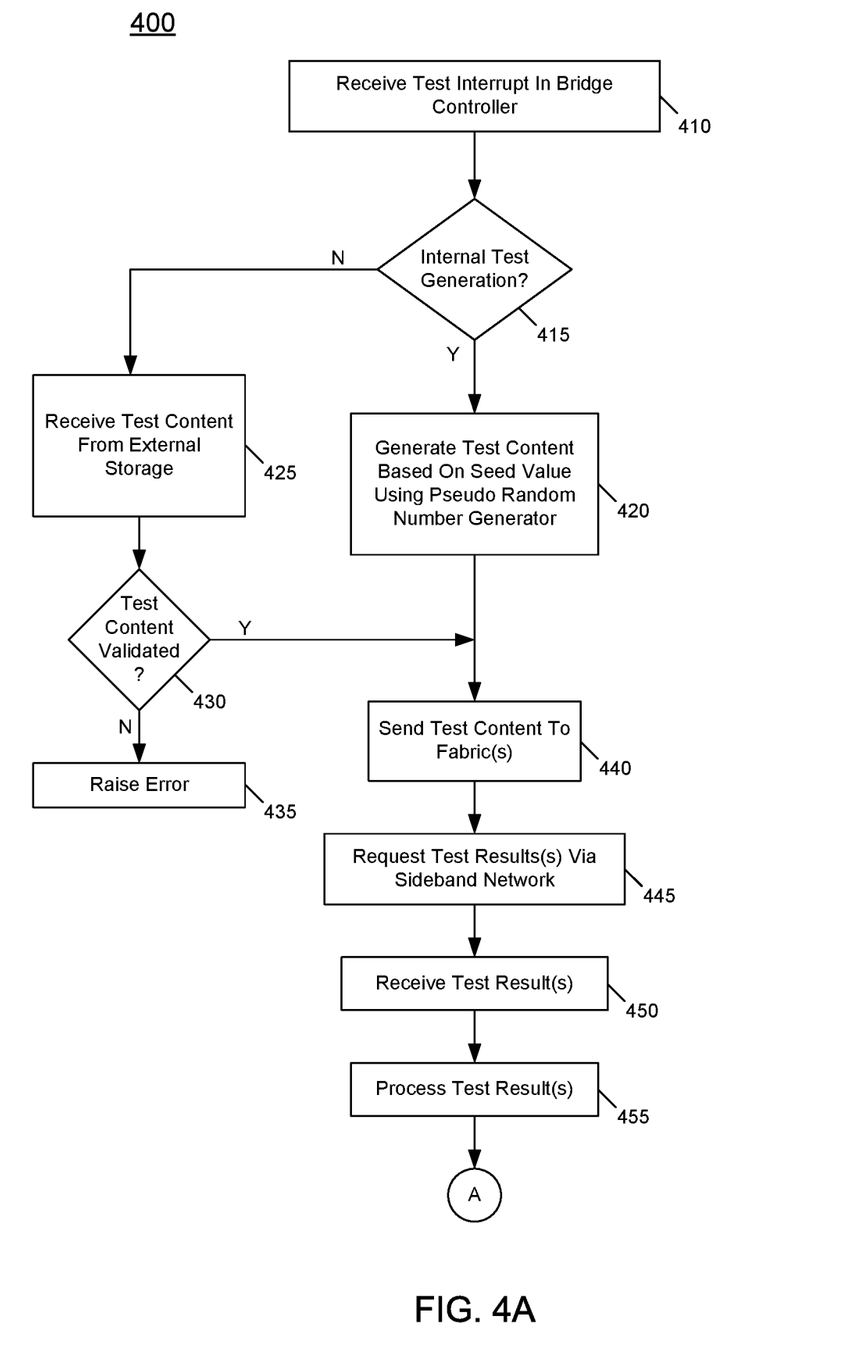
FIGS. 4A and 4B are a flow diagram of a method in accordance with another embodiment of the present invention.
Figure 4B:
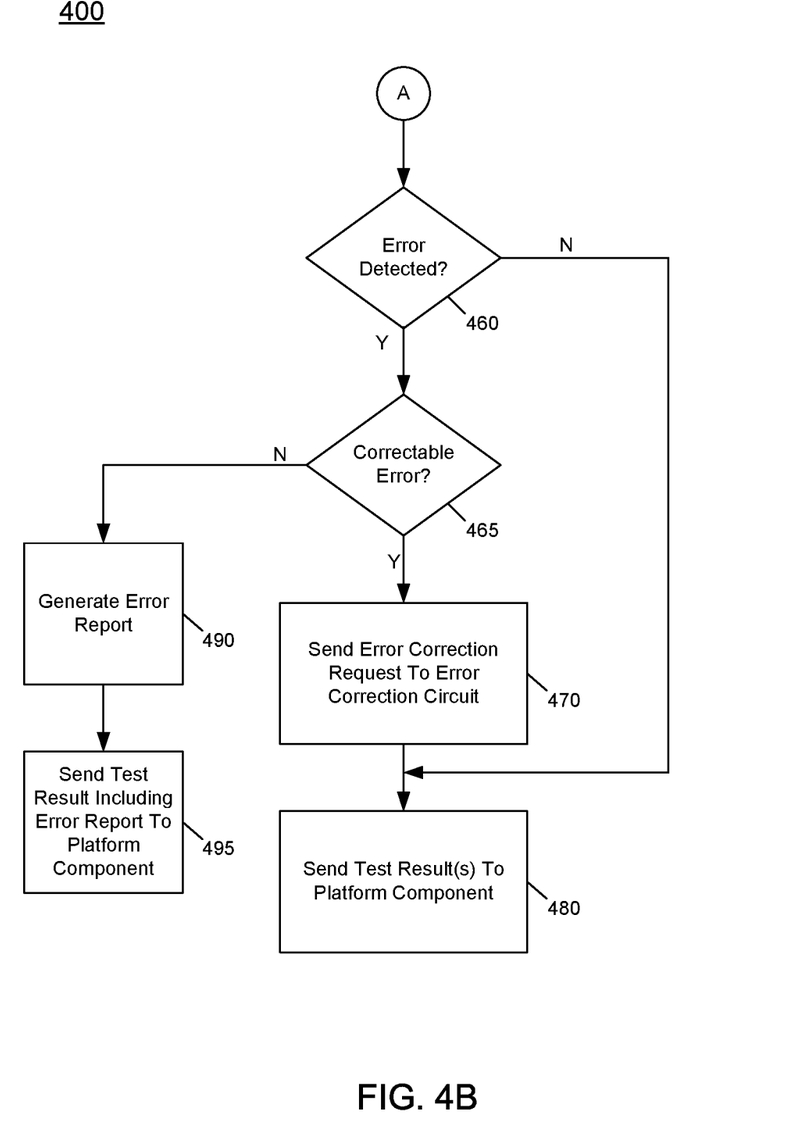

Referring now to FIGS. 4A and 4B, shown is a flow diagram of a method in accordance with another embodiment of the present invention. More specifically, method 400 is a high level view of a functional safety testing process, from the view of a fabric bridge controller as described herein. As such, method 400 may be performed by hardware circuitry, firmware, software and/or combinations thereof. As illustrated, method 400 begins by receiving a test interrupt in the bridge controller (block 410). In an embodiment, this test interrupt signal may be received from system software. As an example, the system software (e.g., firmware) may issue this test interrupt signal when it identifies an appropriate time at which the functional safety testing may be performed. Such time may be an idle period of system operation (such as when a vehicle is stopped), a key on or key off condition or so forth.

In any event, control next passes to diamond 415 to determine whether test content is to be generated internally. In an embodiment, the interrupt signal may identify whether the functional safety test content is to be generated internally or not. In other cases, the interrupt signal may be followed by test content, to indicate that the test content is not to be internally generated. In different situations, internal test generation may occur for more basic testing of a fabric, while instead external test content may be provided to test critical features/functionality of a fabric.

If it is determined to internally generate test content, control passes to block 420. At block 420 the bridge controller may generate the test content based on a seed value. For example, a seed value may be stored in a register within the bridge controller. In an embodiment, test writers can program this register using the sideband network. During test operation this seed value may be provided to a pseudo-random number generator that generates test content in response to this seed value. Random content generation may involve generating commands from a pre-programmed set of errors (e.g., memory read/write, configuration read/write, IO read/write, etc.) and random data associated with it. Commands may be limited in number and stored in registers. Data associated with commands may be generated using a linear feedback shift register (LFSR). For each of the operations, one of the commands at random is chosen and along with it random data may be generated on die using the LFSR. As such, relatively deterministic test content (and thus relatively deterministic test results) can be generated by way of this pseudo-random number generator.

If instead it is determined that internal test generation is to not occur, control proceeds to block 425 where the test content may be received from an external storage (e.g., a given non-volatile memory of the system). Next it is determined whether this test content is validated (diamond 430). In one embodiment, the bridge controller may verify, e.g., using SAI information or so forth, that the test content is authentic. In an embodiment, content is checked for its authenticity to ensure that it has not been tampered with. The checksum of the loaded test program is compared against the expected value and if any discrepancy is found, program execution is terminated. This checksum computation provides a unique signature that distinguishes one digital footprint from another. If authenticity is not found, control passes to block 435 where an error may be raised, e.g., to the firmware that triggered the self testing.

Assuming that the test content is validated, control passes to block 440 where the test content is sent to one or more fabrics. For example, the fabric bridge controller may issue one or more transactions such as posted or non-posted transactions to the various fabrics. To this end, the bridge controller may be configured to generate such transactions including the test content (e.g., a write transaction) that can be directed to particular destinations (e.g., one or more primary scalable fabrics) by way of identification of the fabrics in destination identification information of the transactions, which enables the transactions to be routed to the appropriate destination.

Still with reference to FIG. 4A, at block 445 test results may be requested via a sideband network. That is, the bridge controller may reduce traffic on primary fabrics by requesting test results via a sideband network implemented with multiple sideband routers that couple to various agents and fabrics. In one embodiment, this request may be issued as a non-posted read transaction. Then at block 450 the test results are received via the same sideband network. In turn, these test results may be processed within the bridge controller (block 455). For example, in the instance where the test content is sent to multiple fabrics (and test results are received from the multiple fabrics), this processing may include aggregating test results from the different fabrics into an aggregated result.

Referring now to FIG. 4B, such processing may further include identifying whether one or more errors were detected. Thus control may proceed to diamond 460 to determine whether an error is detected. If so, it may be determined whether the error is correctable (diamond 465).

If not, control passes to block 490 where an error report may be generated. Such error report may include various information regarding the error, including the location of the error, the type of error and so forth. Thereafter at block 495 a test result may be sent to a platform component that includes this error report. Although the scope of the present invention is not limited in this regard, in one embodiment the platform component may be a non-volatile storage. Note however that a test result including an error report may be provided to a system controller to take appropriate action, including raising an error to a user, shutting down some or all of the system, or so forth.

Still with reference to FIG. 4, instead if it determined that an error is correctable, control passes to block 470 where an error correction request may be sent to an error correction circuit. As an example, a correction circuit may block out in a memory map a memory array portion that has detected errors so that this portion of the memory array is not longer to be used. In any event, control next passes to block 480 where a test result can be sent to the platform component. Note in this instance (either due to detection no error or due to detection of a correctable (and corrected) error), the test result may be logged, e.g., in a platform non-volatile storage for later access by system software. Understand while shown at this high level in the embodiment of FIG. 4, many variations and alternatives are possible.

Figure 5:
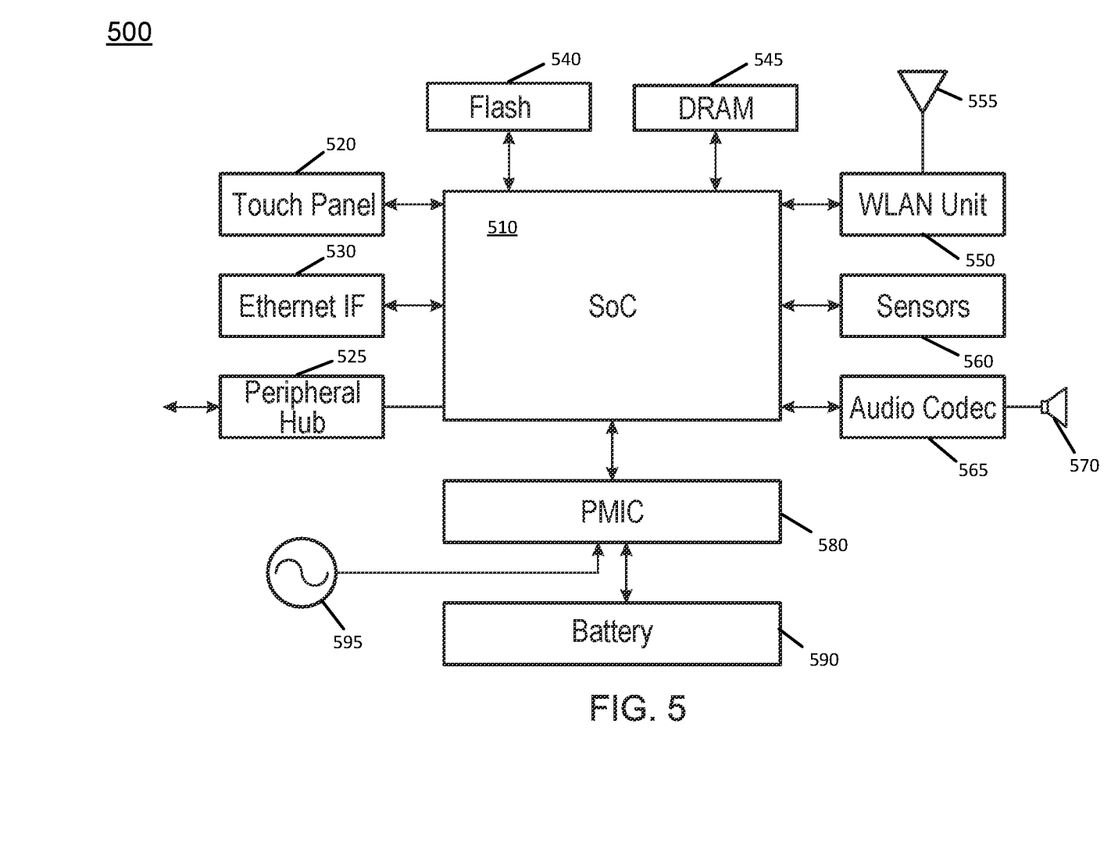
FIG. 5 is a block diagram of an example system with which embodiments may be used.

Functional safety testing as described herein may be implemented in a wide variety of system types, ranging from small portable devices to larger more compute complex devices. Referring now to FIG. 5, shown is a block diagram of an example system with which embodiments may be used. In the illustration of FIG. 5, system 500 may be a mobile system such as a tablet computer, 2:1 tablet, phablet, in-vehicle system, or other system. As illustrated, a SoC 510 is present and may be configured to operate as an application processor for the device. SoC 510 may include agents and fabrics that can be tested during normal operation as described herein.

A variety of devices may couple to SoC 510. In the illustration shown, a memory subsystem includes a flash memory 540 and a DRAM 545 coupled to SoC 510. In addition, a touch panel 520 is coupled to the SoC 510 to provide display capability and user input via touch, including provision of a virtual keyboard on a display of touch panel 520. To provide wired network connectivity, SoC 510 couples to an Ethernet interface 530. A peripheral hub 525 is coupled to SoC 510 to enable interfacing with various peripheral devices, such as may be coupled to system 500 by any of various ports or other connectors.

In addition to internal power management circuitry and functionality within SoC 510, a PMIC 580 is coupled to SoC 510 to provide platform-based power management, e.g., based on whether the system is powered by a battery 590 or AC power via an AC adapter 595. In addition to this power source-based power management, PMIC 580 may further perform platform power management activities based on environmental and usage conditions. Still further, PMIC 580 may communicate control and status information to SoC 510 to cause various power management actions within SoC 510.

Still referring to FIG. 5, to provide for wireless capabilities, a WLAN unit 550 is coupled to SoC 510 and in turn to an antenna 555. In various implementations, WLAN unit 550 may provide for communication according to one or more wireless protocols. As further illustrated, a plurality of sensors 560 may couple to SoC 510. These sensors may include various accelerometer, environmental and other sensors, including user gesture sensors. Finally, an audio codec 565 is coupled to SoC 510 to provide an interface to an audio output device 570. Of course understand that while shown with this particular implementation in FIG. 5, many variations and alternatives are possible.

Figure 6:
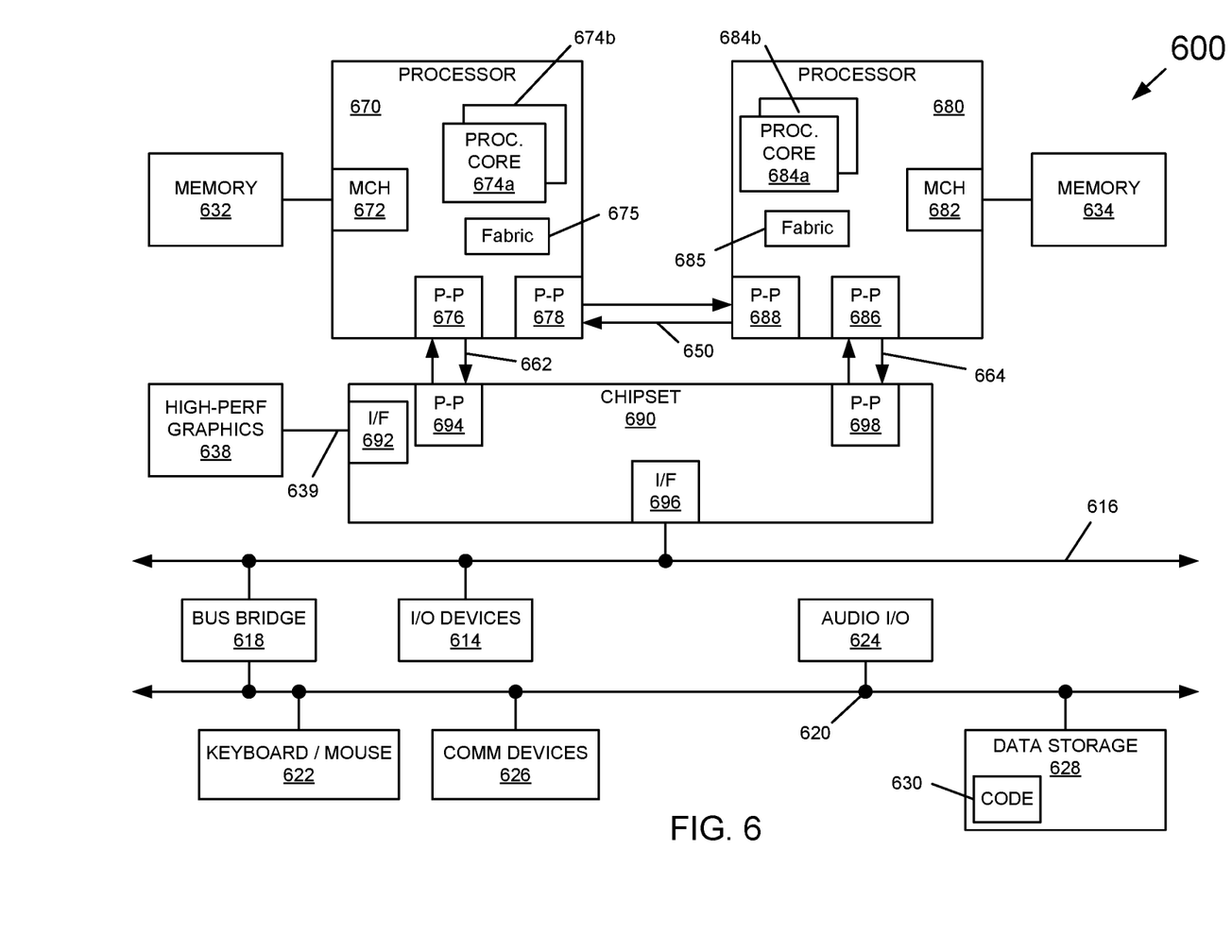
FIG. 6 is a block diagram of a system in accordance with an embodiment of the present invention.

Referring now to FIG. 6, shown is a block diagram of a system in accordance with an embodiment of the present invention. As shown in FIG. 6, multiprocessor system 600 is a point-to-point interconnect system, and includes a first processor 670 and a second processor 680 coupled via a point-to-point interconnect 650. As shown in FIG. 6, each of processors 670 and 680 may be multicore processors, including first and second processor cores (i.e., processor cores 674a and 674b and processor cores 684a and 684b), although potentially many more cores may be present in the processors. Each of the processors can include a fabric (675, 685) or other interconnect circuit on which functional safety testing may be performed as described herein.

Still referring to FIG. 6, first processor 670 further includes a memory controller hub (MCH) 672 and point-to-point (P-P) interfaces 676 and 678. Similarly, second processor 680 includes a MCH 682 and P-P interfaces 686 and 688. As shown in FIG. 6, MCH's 672 and 682 couple the processors to respective memories, namely a memory 632 and a memory 634, which may be portions of system memory (e.g., DRAM) locally attached to the respective processors. First processor 670 and second processor 680 may be coupled to a chipset 690 via P-P interconnects 662 and 664, respectively. As shown in FIG. 6, chipset 690 includes P-P interfaces 694 and 698.

Furthermore, chipset 690 includes an interface 692 to couple chipset 690 with a high performance graphics engine 638, by a P-P interconnect 639. In turn, chipset 690 may be coupled to a first bus 616 via an interface 696. As shown in FIG. 6, various input/output (I/O) devices 614 may be coupled to first bus 616, along with a bus bridge 618 which couples first bus 616 to a second bus 620. Various devices may be coupled to second bus 620 including, for example, a keyboard/mouse 622, communication devices 626 and a data storage unit 628 such as a disk drive or other mass storage device which may include code 630, in one embodiment. Further, an audio I/O 624 may be coupled to second bus 620. Embodiments can be incorporated into other types of systems including mobile devices such as a smart cellular telephone, tablet computer, netbook, Ultrabook™, or so forth.

Figure 7:
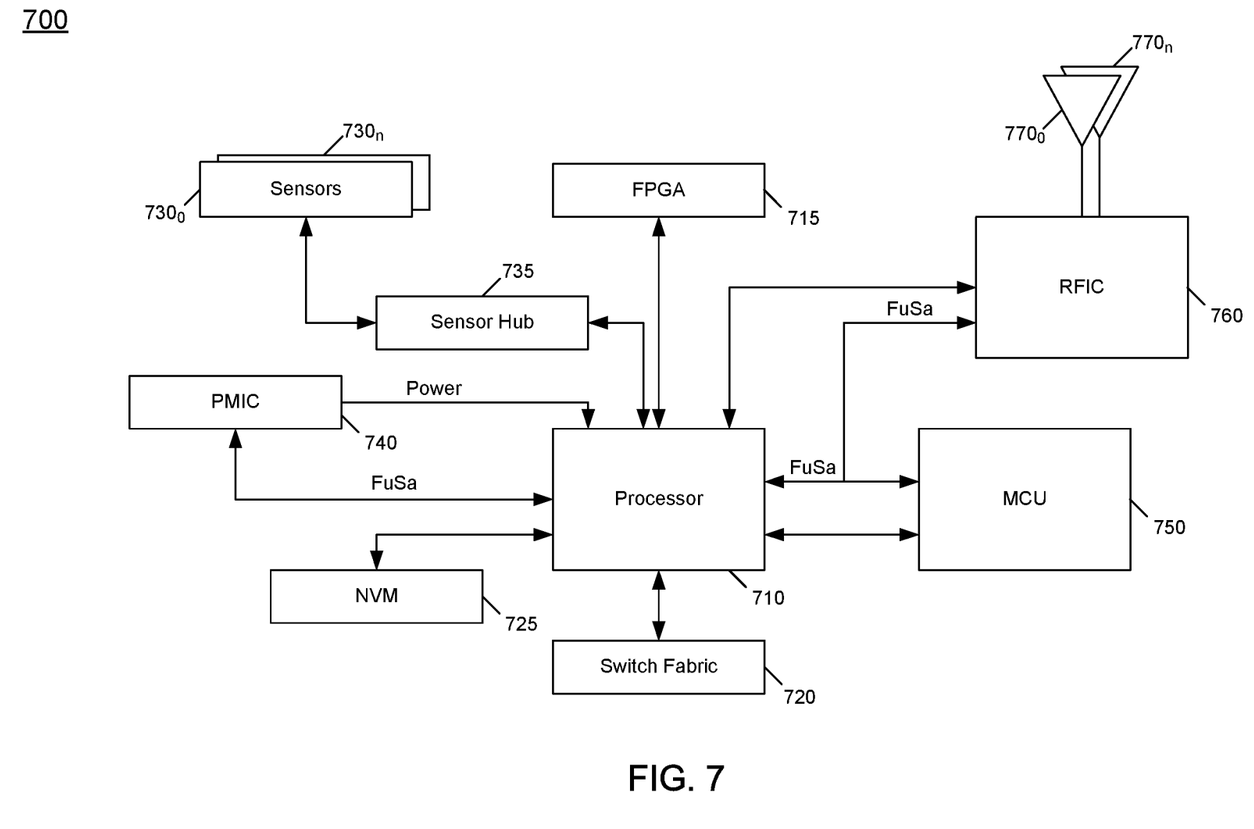
FIG. 7 is a block diagram of a system in accordance with another embodiment of the present invention.

Referring now to FIG. 7, shown is a block diagram of a system in accordance with another embodiment of the present invention. In the embodiment of FIG. 7, system 700 is an autonomous driving computing system. As such, system 700 may be implemented within a vehicle that provides for some level of autonomous driving. Understand that with different levels of autonomous driving control, different levels of workloads may be executed within system 700 to autonomously perform some or all driving tasks autonomously.

In embodiments herein, system 700 may dynamically during functional operation perform functional safety testing as described herein. Such testing may be of various components of the system in a fast and reliable manner that minimizes interruption with normal compute workloads, while at the same time ensuring high levels of functional safety.

As illustrated, system 700 includes a processor 710, which may be a general-purpose multicore processor or other SoC. In different implementations, multiple such processors may be implemented to flexibly allocate autonomous driving workloads across these processors. Processor 710 receives power that is controlled by a power management integrated circuit (PMIC) 740. As further illustrated, functional safety testing as described herein, both within processor 710 and PMIC 740 may occur, with results communicated between these components.

System 700 may further include one or more field programmable gate arrays (FPGAs) 715 or other programmable accelerators to which certain autonomous driving workloads may be offloaded. Processor 710 further couples to a non-volatile memory 725, which in an embodiment may be implemented as a flash memory. As described herein, non-volatile memory 725 may store functional safety test patterns that may be used to perform functional safety testing of processor 710, PMIC 740 and additional components within system 700. To provide communication with other components within a vehicle, processor 710 further couples to a switch fabric 720 which in an embodiment may be implemented as an Ethernet switch fabric that in turn may couple to other components within a vehicle, including display components, vehicle infotainment systems, and so forth. Still further, processor 710 (and switch fabric 720) also couples to a microcontroller 750 which also may be involved in the functional safety testing.

Furthermore, to enable interaction with other systems, including other vehicles, roadway systems, over-the-air update sources, infotainment content sources, sensor data communication and so forth, processor 710 and MCU 750 may couple to one or more radio frequency integrated circuits (RFICs) 760. In embodiments, RFIC 760 may be configured to support 5G-based specifications for communication of automotive and other data via a variety of wireless networks. To this end, RFIC 760 may couple to one or more antennas $770_0$-$770_n$ of a vehicle.

As further illustrated in FIG. 7, system 700 may include a plurality of sensors $730_0$-$730_n$ that provide sensor information, via a sensor hub 735 to processor 710. Although the scope of the present invention is not limited in this regard in embodiments, such sensors may include lidar, ultrasound, radar and optical sensors, among other sensor types. Such sensors may obtain large amounts of sensor data while the vehicle is in operation. Sensor hub 735 may be configured to fuse at least some of this data to provide information regarding the vehicle's surroundings, for provision to processor 710. In turn, processor 710 and/or FPGA 715 may use this fused sensor information in connection with performing autonomous driving workloads. Understand while shown at this high level in the embodiment of FIG. 7, many variations and alternatives are possible.

The following examples pertain to further embodiments.

In one example, an apparatus comprises at least one fabric to interface with a plurality of IP blocks of the apparatus, the at least one fabric including at least one status storage and a fabric bridge controller coupled to the at least one fabric. The fabric bridge controller may be configured to initiate a functional safety test of the at least one fabric in response to a fabric test signal received during functional operation of the apparatus, receive a result of the functional safety test via the at least one status storage, and send to a destination location a test report based on the result.

In an example, the apparatus further comprises a first sideband router coupled to the at least one fabric and the fabric bridge controller, where the first sideband router is to receive the result of the functional safety test and send to the fabric bridge controller the result of the functional safety test.

In an example, the fabric bridge controller comprises a pseudo-random number generator to generate one or more test patterns based on a seed value, where the fabric bridge controller is to send the one or more test patterns to the at least one fabric.

In an example, the fabric bridge controller is to send a first transaction to the at least one fabric, the first transaction including the one or more test patterns.

In an example, the fabric bridge controller includes a second sideband router to send a second transaction to a first sideband router coupled to the at least one fabric to receive the result of the functional safety test.

In an example, the fabric bridge controller further comprises a test analyzer to receive the result of the functional safety test and determine whether an error occurred.

In an example, in response to a correctable error, the fabric bridge controller is to issue an error correction request to an error correction circuit, to enable the error correction circuit to correct the correctable error.

In an example, the fabric bridge controller is to receive a test pattern from a non-volatile storage via a security circuit and in response to validation of security information associated with the test pattern, send the test pattern to the at least one fabric.

In an example, the fabric bridge controller is to aggregate a result of the functional safety test on a plurality of fabrics and communicate the aggregated result to a security circuit coupled to the apparatus, to enable the security circuit to store the aggregated result in a non-volatile storage.

In another example, a method comprises: in response to receiving a test signal in a bridge controller of a SoC during functional operation of a system including the SoC, sending test content to one or more fabrics of the SoC coupled to the bridge controller, to enable the one or more fabrics to test functionality of the one or more fabrics; requesting test result information of the functionality test from the one or more fabrics, via a sideband network coupled between the bridge controller and the one or more fabrics; processing the test result information in the bridge controller; and communicating the processed test result information to a non-volatile memory coupled to the SoC, for storage and access by the system.

In an example, the method further comprises receiving the test signal when an autonomous vehicle computing system comprising the system is in an idle state.

In an example, the method further comprises generating the test content in the bridge controller based at least in part on a seed value.

In an example, the method further comprises receiving the test content from the non-volatile memory and validating the test content prior to sending the test content to the one or more fabrics.

In an example, the method further comprises in response to identifying an error, sending an error message from the bridge controller to a system controller.

In an example, the method further comprises sending the test content to the one or more fabrics as a posted transaction.

In an example, the method further comprises requesting, via a non-posted transaction, the test result information via the sideband network.

In an example, the method further comprises sending the test content to the one or more fabrics from the bridge controller with a security identifier of a security circuit coupled to the SoC.

In another example, a computer readable medium including instructions is to perform the method of any of the above examples.

In another example, a computer readable medium including data is to be used by at least one machine to fabricate at least one integrated circuit to perform the method of any one of the above examples.

In another example, an apparatus comprises means for performing the method of any one of the above examples.

In yet another example, a system includes a SoC that comprises: at least one core to execute instructions; an interconnect coupled to the at least one core; a first fabric coupled to the interconnect to couple a first agent and a second agent, the first fabric including a first storage to store test result information regarding a functional test of the first fabric and a sideband interface to couple the first fabric to a sideband network including a plurality of sideband routers; and a fabric bridge controller coupled to the first fabric. The fabric bridge controller may initiate, during normal operation of the system, the functional test of the first fabric in response to a test signal, receive a result of the functional test of the first fabric comprising the test result information via the sideband network, and send a test report based at least in part on the result to a security circuit. The system further includes the security circuit coupled to the SoC, where the security circuit is to send the fabric test signal to the fabric bridge controller and provide the test report at least to a non-volatile memory. The system further includes the non-volatile memory coupled to the security circuit, where the non-volatile memory is to store the test report and one or more test programs to be provided by the security circuit to the fabric bridge controller.

In an example, the fabric bridge controller is, after the functional test initiation, to send a sideband request via the sideband network to request from the first fabric the result of the functional test of the first fabric.

In an example, in response to an error indication in the result, the fabric bridge controller is to include the error indication in the test report, and in response to the error indication included in the test report, the security circuit is to send a message to a system controller to cause the system controller to perform an action on the system, the system comprising an autonomous vehicle system.

In a still further example, an apparatus comprises: means for sending test content to one or more fabric means of a system on chip, to enable the one or more fabric means to test functionality of the one or more fabric means; sideband means for requesting test result information of the functionality test from the one or more fabric means; means for processing the test result information; and means for communicating the processed test result information to a non-volatile storage means, for storage and access by an autonomous vehicle computing system.

In an example, the apparatus further comprises means for receiving a test signal when the autonomous vehicle computing system is in an idle state, the means for sending the test content to send the test content in response to the test signal.

In an example, the apparatus further comprises means for generating the test content based at least in part on a seed value.

In an example, the apparatus further comprises means for sending the test content to the one or more fabric means as a posted transaction.

In an example, the sideband means is to request the test result information via a non-posted transaction.

Understand that various combinations of the above examples are possible.

Note that the terms "circuit" and "circuitry" are used interchangeably herein. As used herein, these terms and the term "logic" are used to refer to alone or in any combination, analog circuitry, digital circuitry, hard wired circuitry, programmable circuitry, processor circuitry, microcontroller circuitry, hardware logic circuitry, state machine circuitry and/or any other type of physical hardware component. Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. Embodiments also may be implemented in data and may be stored on a non-transitory storage medium, which if used by at least one machine, causes the at least one machine to fabricate at least one integrated circuit to perform one or more operations. Still further embodiments may be implemented in a computer readable storage medium including information that, when manufactured into a SoC or other processor, is to configure the SoC or other processor to perform one or more operations. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
at least one fabric to interface with a plurality of intellectual property (IP) blocks, the at least one fabric including at least one status storage; and
a fabric bridge controller coupled to the at least one fabric, the fabric bridge controller to initiate a functional safety test of the at least one fabric in response to a fabric test signal received during functional operation of the apparatus, receive a result of the functional safety test via the at least one status storage, and send a test report based at least in part on the result to a security circuit, wherein the security circuit is to send the fabric test signal to the fabric bridge controller and provide the test report at least to a non-volatile memory, the non-volatile memory to store the test report, and in response to a correctable error, the apparatus is to initiate correction of the correctable error.

2. The apparatus of claim 1, further comprising a first sideband router to receive the result of the functional safety test and send to the fabric bridge controller the result of the functional safety test.

3. The apparatus of claim 1, wherein the fabric bridge controller comprises a pseudo-random number generator to generate one or more test patterns based on a seed value, wherein the fabric bridge controller is to send the one or more test patterns to the at least one fabric.

4. The apparatus of claim 3, wherein the fabric bridge controller is to send a first transaction to the at least one fabric, the first transaction including the one or more test patterns.

5. The apparatus of claim 4, wherein a second sideband router is to send a second transaction to a first sideband router coupled to the at least one fabric to receive the result of the functional safety test.

6. The apparatus of claim 1, wherein the fabric bridge controller further comprises a test analyzer to receive the result of the functional safety test and determine whether an error occurred.

7. The apparatus of claim 6, wherein in response to the correctable error, the fabric bridge controller is to issue an error correction request to an error correction circuit, to enable the error correction circuit to correct the correctable error.

8. The apparatus of claim 1, wherein the fabric bridge controller is to receive a test pattern from the non-volatile memory and in response to validation of security information associated with the test pattern, send the test pattern to the at least one fabric.

9. The apparatus of claim 1, wherein the fabric bridge controller is to aggregate a result of the functional safety test on a plurality of fabrics and communicate the aggregated result for storage in the non-volatile memory.

10. A non-transitory machine-readable medium having stored thereon instructions, which if performed by a machine cause the machine to perform a method comprising:
in response to receiving a test signal in a system on chip (SoC) during functional operation of a system including the SoC, sending test content to one or more fabrics of the SoC, to enable the one or more fabrics to test functionality of the one or more fabrics;
requesting test result information of the functionality test from the one or more fabrics;
processing the test result information; and
communicating the processed test result information to a non-volatile memory coupled to the SoC, and in response to identifying a correctable error, initiating correction of the correctable error.

11. The non-transitory machine-readable medium of claim 10, wherein the method further comprises receiving the test signal when an autonomous vehicle computing system comprising the system is in an idle state.

12. The non-transitory machine-readable medium of claim 10, wherein the method further comprises generating the test content in a bridge controller based at least in part on a seed value.

13. The non-transitory machine-readable medium of claim 10, wherein the method further comprises receiving the test content from the non-volatile memory and validating the test content prior to sending the test content to the one or more fabrics.

14. The non-transitory machine-readable medium of claim 10, wherein the method further comprises in response to identifying the correctable error, sending an error message to a system controller.

15. The non-transitory machine-readable medium of claim 10, wherein the method further comprises sending the test content to the one or more fabrics as a posted transaction.

16. The non-transitory machine-readable medium of claim 15, wherein the method further comprises requesting, via a non-posted transaction, the test result information.

17. The non-transitory machine-readable medium of claim 10, wherein the method further comprises sending the test content to the one or more fabrics with a security identifier of a security circuit coupled to the SoC.

18. A system comprising:
a system on chip (SoC) comprising:
at least one core to execute instructions;
an interconnect coupled to the at least one core;
a first fabric coupled to the interconnect to couple a first agent and a second agent, the first fabric including a first storage to store test result information regarding a functional test of the first fabric and a sideband interface to couple the first fabric to a sideband network including a plurality of sideband routers; and
a fabric bridge controller coupled to the first fabric, the fabric bridge controller to initiate, during normal operation of the system, the functional test of the first fabric in response to a test signal, receive a result of the functional test of the first fabric comprising the test result information, and send a test report based at least in part on the result to a security circuit;
the security circuit coupled to the SoC, wherein the security circuit is to send the test signal to the fabric bridge controller and provide the test report at least to a non-volatile memory, and in response to an error indication send a message to a system controller to cause the system controller to shut down the system until a corrective action is taken on the system; and
the non-volatile memory coupled to the security circuit, wherein the non-volatile memory is to store the test report and one or more test programs.

19. The system of claim 18, wherein the fabric bridge controller is, after the functional test initiation, to send a sideband request via the sideband network to request from the first fabric the result of the functional test of the first fabric.

20. The system of claim 18, wherein in response to the error indication, the fabric bridge controller is to include the error indication in the test report, the system comprising an autonomous vehicle system.

* * * * *